(12) United States Patent
Lee et al.

(10) Patent No.: US 9,900,995 B2
(45) Date of Patent: Feb. 20, 2018

(54) TOUCH PANEL AND METHOD FOR MANUFACTURING THE SAME

(75) Inventors: Dong Youl Lee, Seoul (KR); Young Sun You, Seoul (KR); Kyoung Hoon Chai, Seoul (KR); Young Jin Noh, Seoul (KR); Yong Jin Lee, Seoul (KR); Sun Young Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 233 days.

(21) Appl. No.: 13/978,178

(22) PCT Filed: Jan. 3, 2012

(86) PCT No.: PCT/KR2012/000030
§ 371 (c)(1),
(2), (4) Date: Jul. 3, 2013

(87) PCT Pub. No.: WO2012/093827
PCT Pub. Date: Jul. 12, 2012

(65) Prior Publication Data
US 2013/0279138 A1   Oct. 24, 2013

(30) Foreign Application Priority Data
Jan. 3, 2011   (KR) .................. 10-2011-0000297

(51) Int. Cl.
*H05K 3/46* (2006.01)
*H05K 1/02* (2006.01)
*G06F 3/044* (2006.01)

(52) U.S. Cl.
CPC .............. *H05K 3/46* (2013.01); *G06F 3/044* (2013.01); *H05K 1/0298* (2013.01);
(Continued)

(58) Field of Classification Search
CPC .......... G06F 3/044; H05K 3/46; H05K 1/0298
(Continued)

(56) References Cited

U.S. PATENT DOCUMENTS 6,596,200 B1 *  7/2003  Ogawa ..................... H01B 1/22
                                                        174/110 R
8,803,830 B2 *  8/2014  Nakanishi et al. .......... 345/173
(Continued)

FOREIGN PATENT DOCUMENTS

JP          2010-267223 A      11/2010
KR     10-2002-0009034 A        2/2002
(Continued)

OTHER PUBLICATIONS

International Search Report in International Application No. PCT/KR2012/000030, filed Jan. 3, 2012.
Office Action dated Oct. 9, 2013 in Taiwanese Application No. 101100163, filed Jan. 3, 2012.

*Primary Examiner* — William H Mayo, III
*Assistant Examiner* — Hiram E Gonzalez
(74) *Attorney, Agent, or Firm* — Saliwanchik, Lloyd & Eisenschenk

(57) ABSTRACT

Provided is a method for manufacturing a touch panel. In the method, a substrate is prepared, a transparent electrode is formed on the substrate, an interconnection electrode material is applied to the substrate by printing, an interconnection electrode is formed by drying the interconnection electrode material, and a circuit board is disposed on the interconnection electrode.

8 Claims, 2 Drawing Sheets

(52) U.S. Cl.
CPC .............. *G06F 2203/04103* (2013.01); *G06F 2203/04112* (2013.01); *Y10T 29/49126* (2015.01)

(58) Field of Classification Search
USPC ........................................................ 361/803
See application file for complete search history.

(56) References Cited

U.S. PATENT DOCUMENTS

| | | | |
|---|---|---|---|
| 2005/0046622 A1* | 3/2005 | Nakanishi et al. ............ | 345/173 |
| 2009/0096759 A1* | 4/2009 | Nishiwaki ................ | G06F 3/041 345/173 |
| 2009/0297739 A1* | 12/2009 | Baily et al. ................. | 428/32.74 |
| 2010/0182253 A1* | 7/2010 | Park ......................... | G06F 3/044 345/173 |
| 2010/0283762 A1* | 11/2010 | Takusa .................... | G06F 3/044 345/174 |
| 2011/0109590 A1* | 5/2011 | Park ....................... | G06F 3/0412 345/174 |
| 2011/0169751 A1* | 7/2011 | Kim et al. .................... | 345/173 |
| 2011/0175036 A1 | 7/2011 | Masahiro et al. | |
| 2012/0090875 A1* | 4/2012 | Chae et al. ................ | 174/126.2 |

FOREIGN PATENT DOCUMENTS

| | | | |
|---|---|---|---|
| KR | 10-0337026 B1 | 5/2002 | |
| KR | 10-0894710 B1 | 4/2009 | |
| TW | 201022383 A | 6/2010 | |

* cited by examiner

[Fig. 1]
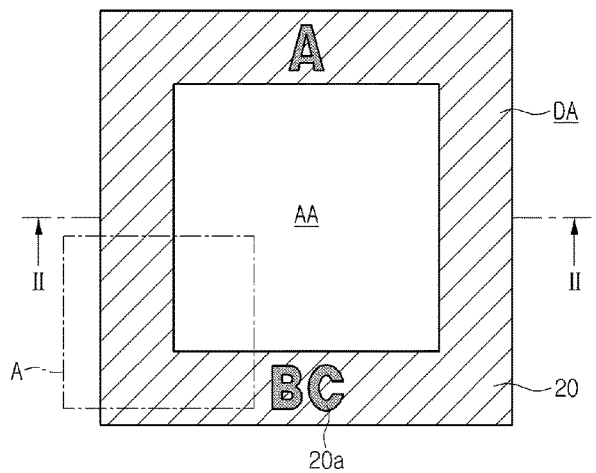
[Fig. 2]
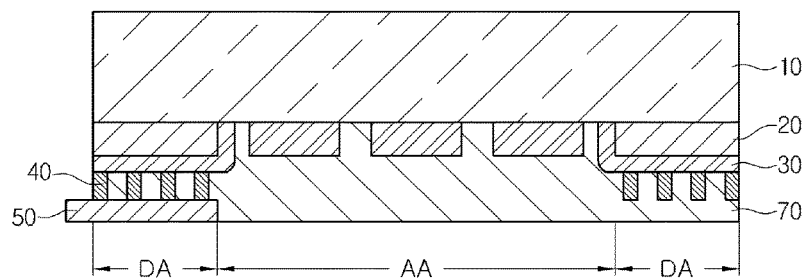
[Fig. 3]
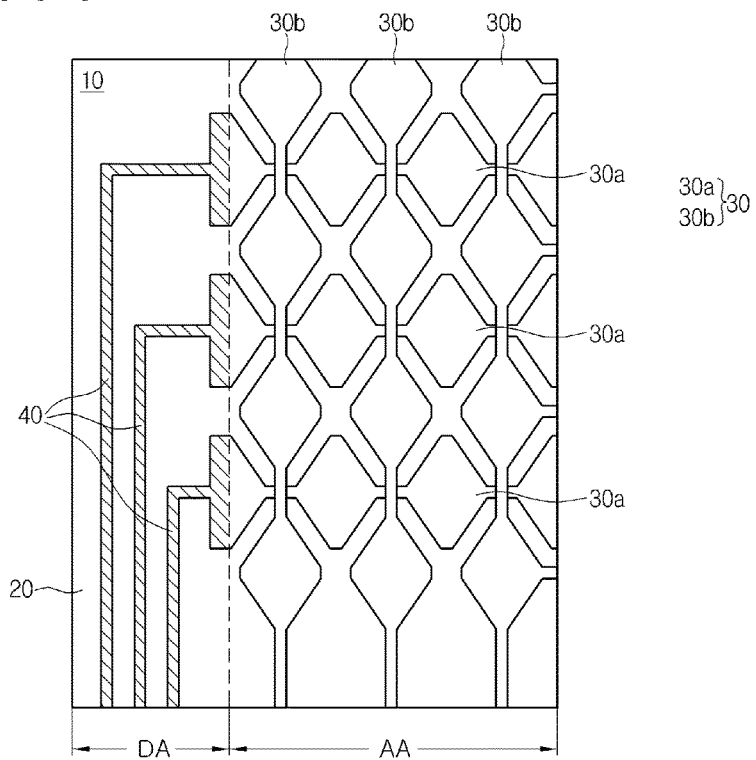

[Fig. 4]
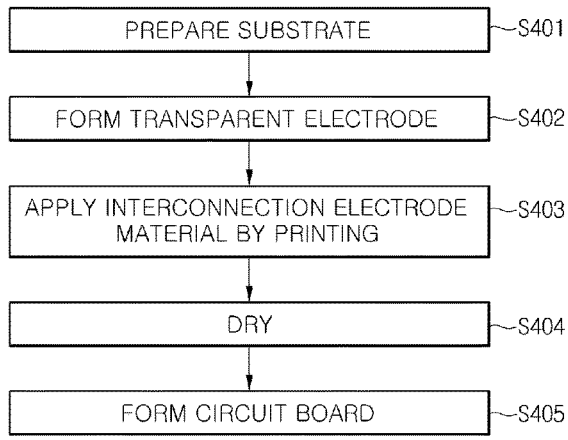
[Fig. 5]
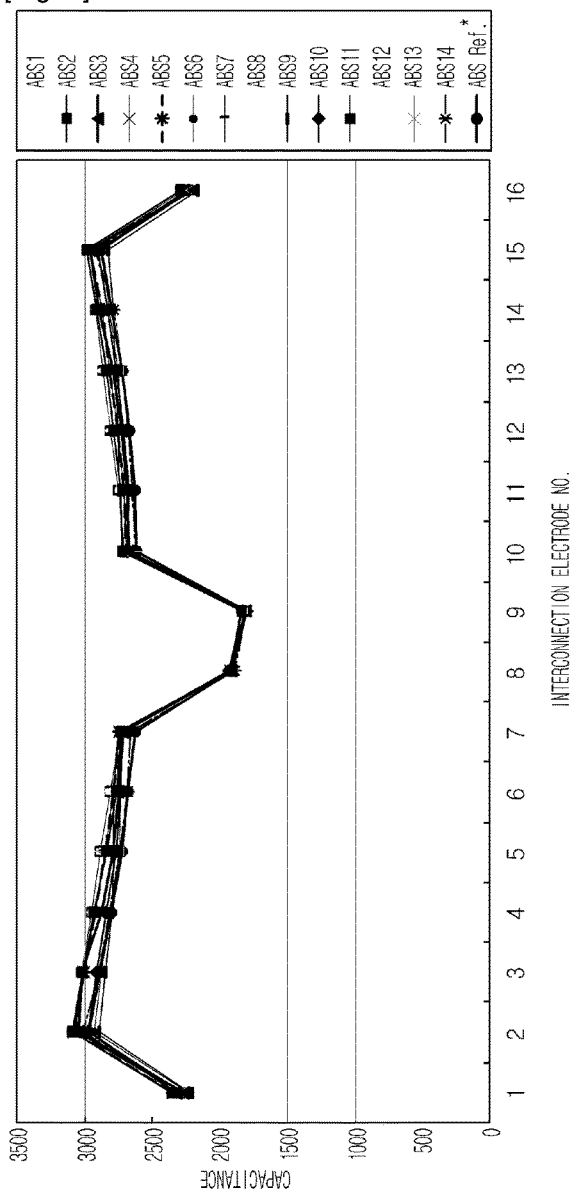

TOUCH PANEL AND METHOD FOR MANUFACTURING THE SAME

CROSS-REFERENCE TO RELATED APPLICATIONS

This application is the U.S. national stage application of International Patent Application No. PCT/KR2012/000030, filed Jan. 3, 2012, which claims priority to Korean Application No. 10-2011-0000297, filed Jan. 3, 2011, the disclosures of each of which are incorporated herein by reference in their entirety.

TECHNICAL FIELD

The present disclosure relates to a touch panel and a method for manufacturing the touch panel.

BACKGROUND ART

Recently, various electronic products are equipped with touch panels so that users can input commands by touching a display screen with their finger or an input instrument such as a stylus.

Touch panels can be classified into: a resistive type and a capacitive type. Resistive type touch panels detect the location of a touch as a glass substrate and an electrode are short-circuited by a pressure applied through an input instrument. Capacitive type touch panels detect the location of a touch as the capacitance between electrodes is varied by the touch.

Such touch panels include interconnection electrodes for connecting electrodes to external circuits. Many processes such as a vacuum deposition process, a photolithography process, and an etch process are necessary for forming interconnection electrodes.

Thus, process complicity, time, and costs are increased due to interconnection electrodes.

DISCLOSURE OF INVENTION

Technical Problem

Embodiments provide a method for manufacturing a touch panel by forming interconnection electrodes through a simple process.

Solution to Problem

In one embodiment, there is provided a method for manufacturing a touch panel, the method including: preparing a substrate; forming a transparent electrode on the substrate; applying an interconnection electrode material to the substrate by printing; forming an interconnection electrode by drying the interconnection electrode material; and forming a circuit board on the interconnection electrode.

In another embodiment, a touch panel includes: a substrate; a transparent electrode on the substrate; an interconnection electrode connected to the transparent electrode; and a circuit board connected to the interconnection electrode, wherein the interconnection electrode and the circuit board are in direct contact with each other.

Advantageous Effects of Invention

According to the embodiments, the interconnection electrode can be formed through a simple printing process. In addition, the circuit board can be stably attached to the interconnection electrode although an additional screen printing process is not performed. Furthermore, according to the embodiments, since the interconnection electrode can be formed through a low-temperature drying process, the interconnection electrode can be firmly attached to the substrate without glass frit.

According to the embodiments, the interconnection electrode can have a narrow width. Therefore, a bezel for hiding the interconnection electrode can be small, and thus various designs may be possible owing to the small size of the bezel. In addition, since the interconnection electrode is narrow, many interconnection electrodes can be formed on the substrate although a bezel is narrow.

BRIEF DESCRIPTION OF DRAWINGS

FIG. 1 is a schematic plan view illustrating a touch panel according to an embodiment.

FIG. 2 is a sectional view taken along line II-II' of FIG. 1.

FIG. 3 is an enlarged view of portion (A) of FIG. 1.

FIG. 4 is a flowchart for explaining a method for manufacturing a touch panel according to an embodiment.

FIG. 5 is a graph showing capacitances of a related art touch panel and a touch panel of an embodiment.

MODE FOR THE INVENTION

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the dimensions and size of each layer (or film), region, pattern or structure may be exaggerated, omitted, or schematically illustrated for convenience in description and clarity.

Reference will now be made in detail to the embodiments of the present disclosure, examples of which are illustrated in the accompanying drawings.

First, a touch panel will be briefly described according to an embodiment with reference to FIGS. 1 to 3, and then a method for manufacturing a touch panel will be explained.

FIG. 1 is a schematic plan view illustrating a touch panel according to an embodiment, and FIG. 2 is a sectional view taken along line II-II of FIG. 1. FIG. 3 is an enlarged view of portion (A) of FIG. 1.

Referring to FIGS. 1 to 3, the touch panel of the current embodiment includes: an effective region AA in which a touch by an input instrument can be detected; and a dummy region DA surrounding the effective region AA.

Transparent electrodes 30 may be disposed in the effective region AA for detecting a touch by an input instrument. Interconnection electrodes 40 and a printed circuit board 50 may be disposed in the dummy region DA. The interconnection electrodes 40 may be connected to the transparent electrodes 30, and the printed circuit board 50 may connect the interconnection electrodes 40 to an external circuit (not shown). An outer dummy layer 20 may be disposed in the dummy region DA, and a logo 20a may be formed on the outer dummy layer 20. The touch panel will now be described in more detail.

Referring to FIG. 2, the outer dummy layer 20 and the transparent electrodes 30 may be disposed on a substrate 10.

The interconnection electrodes 40 may be connected to the transparent electrodes 30, and the printed circuit board 50 may be connected to the interconnection electrodes 40. An anti-scattering film 70 may be disposed on the transparent electrodes 30, the interconnection electrodes 40, and the printed circuit board 50 as a cover and separation-preventing film.

The substrate 10 may be formed of various materials that can support the outer dummy layer 20, transparent electrodes 30, and the interconnection electrodes 40. For example, the substrate 10 may be a glass substrate or a plastic substrate.

The outer dummy layer 20 is disposed in the dummy region DA of the substrate 10. A material having a predetermined color may be applied to the outer dummy layer 20 so that the interconnection electrodes 40 and the printed circuit board 50 cannot be seen from the outside of the touch panel. The outer dummy layer 20 may be colored according to a desired external color of the touch panel. For example, the outer dummy layer 20 may be colored black using a black pigment. Logos (such as the logo 20a shown in FIG. 1) may be formed on the outer dummy layer 20 by various methods. For example, deposition, printing, or wet coating may be used.

Thereafter, the transparent electrodes 30 are disposed. The transparent electrodes 30 may be formed into any shape suitable for detecting a touch by a finger or an input instrument.

For example, as shown in FIG. 3, the transparent electrodes 30 may include first transparent electrodes 30a and second transparent electrodes 30b. The first transparent electrodes 30a may be formed in a first direction (horizontal direction in FIG. 3), and the second transparent electrodes 30b may be formed in a second direction (vertical direction in FIG. 3).

The transparent electrodes 30 may include a transparent conductive material to conduct electricity while transmitting light. For this, the transparent electrodes 30 may include a material such as indium tin oxides, indium zinc oxides, copper oxides, carbon nano tubes (CNTs).

Referring to FIG. 2, the interconnection electrodes 40 and the printed circuit board 50 are disposed in the dummy region DA of the substrate 10. The interconnection electrodes 40 are connected to the transparent electrodes 30, and the printed circuit board 50 is connected to the interconnection electrodes 40. Since the interconnection electrodes 40 are disposed in the dummy region DA, the interconnection electrodes 40 can be formed of a highly conductive metal. The printed circuit board 50 may be selected from various printed circuit boards. For example, a flexible printed circuit board (FPCB) may be used as the printed circuit board 50.

The anti-scattering film 70 may be disposed on the transparent electrodes 30, the interconnection electrodes 40, and the printed circuit board 50 as a cover and separation-preventing film. The anti-scattering film 70 prevents scattering of fragments in the case where the touch panel is impacted and broken. The anti-scattering film 70 may be formed into various shapes using various materials. In the current embodiment, the anti-scattering film 70 is disposed on a lower side of the substrate 10. However, the position of the anti-scattering film 70 is not limited thereto. That is, the anti-scattering film 70 may be disposed at another position.

Hereinafter, a method for manufacturing a touch panel will be described in detail with reference to FIG. 4 according to an embodiment. For clarity and conciseness, detailed descriptions which are the same as or similar to the above descriptions are not repeated, and differences are described in detail.

FIG. 4 is a flowchart for explaining a method for manufacturing a touch panel according to an embodiment.

First, a glass or plastic substrate may be prepared (S401).

Next, transparent electrodes are disposed on the substrate (S402). In operation S402, the transparent electrodes may be formed by a deposition method such as reactive sputtering. However, the current embodiment is not limited thereto. That is, the transparent electrodes may be formed by various methods.

Thereafter, an interconnection electrode material is applied to a dummy region of the substrate (refer to the dummy region DA shown in FIG. 3) by a printing method (S403). In operation S403, the interconnection electrode material may be applied by using various printing methods such as gravure offset printing, reverse offset printing, screen printing, and gravure printing.

Gravure offset printing may be performed as follows: a plate engraved with a pattern is smeared with paste; the pattern is first transferred to a silicon rubber called blanket; and the pattern is secondarily transferred by bringing the blanket into contact with a substrate on which a conductive layer is formed.

Reverse offset printing may be performed as follows: paste is applied to a roll-type blanket; the blanket is brought into contact with a patterned cliche to form an intended pattern on the blanket; and a conductive layer is patterned using the blanket.

Screen printing may be performed as follows: paste is applied to a screen having a pattern; and a squeegee is rolled on the screen to apply the paste through holes of the screen to a substrate on which a conducive layer is formed.

Gravure printing may be performed as follows: a patterned blanket is wound around a roll and is smeared with paste; and a substrate on which a conductive layer is formed is patterned using the patterned blanket wound around the roll.

In the current embodiment, the above-described methods may be used independently or in combination. Also, any other printing method known to those skilled in the art may be used.

In the related art, many processes such as a vacuum deposition process and an etch process are necessary to form interconnection electrodes. However, according to the embodiment of the present disclosure, interconnection electrodes can be formed only through a printing process, and thus time and costs can be saved.

The interconnection electrode material may include metal paste that can be applied by a printing method. For example, the paste may contain an Ag powder, a binder, and a solvent.

The paste may include 60 to 85 parts by weight of the Ag powder for every 100 parts by weight of the paste. If the Ag powder content is less than 60 parts by weight, the electric conductive of the paste is too low for forming interconnection electrodes, and if the Ag powder content is greater than 85 parts by weight, it may be difficult to carry out a printing process because the solvent content is relatively low.

The binder may include an epoxy-containing binder, and 5 to 15 parts by weight of the binder may be included for every 100 parts by weight of the paste. If the binder content is less than 5 parts by weight, the interconnection electrode material may not be firmly attached to the substrate, and if the binder content is greater than 15 parts by weight, it may be difficult to carry out a printing process.

The solvent may include an ether-containing solvent, and 10 to 25 parts by weight of the solvent may be included for every 100 parts by weight of the paste. If the solvent content is less than 10 parts by weight, it may be difficult to carry out a printing process, and if the solvent content is greater than 25 parts by weight, the paste may be too wet for printing.

In operation S403, the interconnection electrode material can be formed in a single layer through a single printing process. In the related art, interconnection electrodes formed to a thickness of 0.5 μm or less through a deposition process has a high electric resistance due to the thin thickness. Thus, it is necessary to form multi layers of Ag and Mo. However, according to the current embodiment, interconnection electrodes are formed in a single layer containing silver (Ag) and having a thickness in the range from 1 μm to 10 μm through a printing process. Thus, the electric resistance of the interconnection electrodes can be sufficiently low although the interconnection electrodes are formed in a single layer.

In addition, the width of interconnection electrodes can be adjusted to the range of 30 μm to 100 μm. Therefore, a bezel for hiding interconnection electrodes can have a small size, and thus various designs may be possible. In addition, since narrow interconnection electrodes can be formed, more interconnection electrodes can be disposed on the substrate although a bezel is narrow.

Next, the interconnection electrode material may be dried to form interconnection electrodes (S404). Specifically, in operation S404, drying may be carried out at a temperature of 150° C. to 200° C. That is, since low-temperature drying is possible, the interconnection electrodes can be firmly attached to the substrate without glass frit.

In operation S404, a hot-air drying method or an infrared drying method may be used. In the hot-air drying method, a drying machine may heat air and blow the heated air (hot wind) into a closed area. The infrared drying method may be performed using heat generating when infrared rays collide with the interconnection electrode material.

Thereafter, a circuit board is disposed on the interconnection electrodes (S405). The circuit board makes direct contact with the interconnection electrodes. If a circuit board is directly brought into contact with interconnection electrodes formed by a deposition method, cracks may be generated. Thus, an additional printing process such as a screen printing process is necessary to apply paste to a region on which a circuit board is to be disposed. However, according to the current embodiment, although an additional screen printing process is not performed, the circuit board can be stably attached to the interconnection electrodes because the interconnection electrodes are formed by a printing method.

Next, with reference to FIG. 5, the capacitance of a touch panel of the related art will be compared with the capacitance of a touch panel of an embodiment.

FIG. 5 is a graph showing capacitances of a related art touch panel and a touch panel of an embodiment.

Referring to FIG. 5, capacitance values (absolutely measured values) of fourteen interconnection electrodes ABS1 to ABS14 formed according to an embodiment are not largely different from a capacitance value of an interconnection electrode ABS ref. formed according to the related art. That is, it can be understood that interconnection electrodes formed according to an embodiment of the present disclosure can be applied to a touch panel.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a touch panel, comprising:
preparing a substrate comprising an effective region and a dummy region;
forming an outer dummy layer having a black pigment on the dummy region surrounding a first side, a second side, a third side, and a fourth side of the effective region of the substrate;
forming a first transparent electrode in the effective region, the first transparent electrode extending in a first direction into the dummy region of the substrate to completely pass through the dummy region of the substrate;
forming a second transparent electrode in the effective region, the second transparent electrode extending in a second direction crossing the first direction into the dummy region of the substrate to completely pass through the dummy region of the substrate;
applying an interconnection electrode material comprising a silver (Ag) paste to at least one of the first transparent electrode and second transparent electrode by printing such that only a single layer of the interconnection electrode material is formed;
forming an interconnection electrode having a thickness in a range of 1 μm to 10 μm and a width in a range of 30 μm to 100 μm by drying the interconnection electrode material at a temperature between 150° C. and 200° C.;
forming a circuit board on the interconnection electrode; and
forming an anti-scattering film on the first transparent electrode, the second transparent electrode, the interconnection electrode, and the circuit board, the anti-scattering film filling areas between the first and second transparent electrodes;
wherein one end of the interconnection electrode connected to at least one of the first transparent electrode and second transparent electrode has a first width, and the other end of the interconnection electrode opposite to the one end has a second width;
wherein the first width is greater than the second width, and
wherein the interconnection electrode comprises a first bent portion and a second bent portion, the first bent portion having a shape of "T".

2. The method according to claim 1, wherein the applying of the interconnection electrode material is performed by a method including at least one of gravure offset printing, reverse offset printing, screen printing, and gravure printing.

3. The method according to claim 1, wherein the interconnection electrode material is dried by at least one of a hot-air drying method and an infrared drying method.

4. The method according to claim 1, wherein the circuit board is directly brought into contact with the interconnection electrode.

5. A touch panel comprising:
- a substrate comprising an effective region and a dummy region;
- wherein the dummy region surrounds a first side, a second side, a third side, and a fourth side of the effective region;
- an outer dummy layer only disposed on the dummy region of the substrate, wherein a bottom surface of the outer dummy layer is in direct contact with the substrate;
- a transparent electrode on the effective region of the substrate and in direct contact with the substrate,
- wherein the transparent electrode is in direct contact with the outer dummy layer on the dummy region of the substrate,
- wherein the transparent electrode extends from the effective region to the dummy region,
- wherein the transparent electrode is disposed at a side surface and a top surface of the outer dummy layer,
- the transparent electrode covering the side surface of the outer dummy layer and the top surface of the outer dummy layer;
- an interconnection electrode connected to the transparent electrode, the interconnection electrode being formed with only a single layer;
- a circuit board connected to the interconnection electrode; and
- an anti-scattering film covering the transparent electrode, the interconnection electrode, and the circuit board;
- wherein one surface of the interconnection electrode is in direct contact with the transparent electrode, and the other surface opposite to the one surface of the interconnection electrode is in direct contact with the circuit board;
- wherein the interconnection electrode and the circuit board are only disposed in the dummy region,
- wherein the circuit board includes a flexible printed circuit board;
- wherein the interconnection electrode comprises a paste having an Ag powder, an epoxy-containing binder, and an ether-containing material;
- wherein the interconnection electrode has a thickness between 1 μm and 10 μm,
- wherein the interconnection electrode has a width between 30 μm and 100 μm,
- wherein the transparent electrode comprises a first transparent electrode and a second transparent electrode,
- wherein the first transparent electrode is disposed in the effective region and extends in a first direction into the dummy region to completely pass through the dummy region of the substrate,
- wherein the second transparent electrode is disposed in the effective region and extends in a second direction crossing the first direction into the dummy region to completely pass through the dummy region of the substrate,
- wherein the outer dummy layer comprises a black pigment,
- wherein the transparent electrode comprises material different from that of the interconnection electrode,
- wherein the transparent electrode has a light transmittance greater than the interconnection electrode,
- wherein the paste comprises 60 to 85 parts by weight of the Ag powder per 100 parts by weight of the paste,
- wherein the paste comprises 5 to 15 parts by weight of the binder per 100 parts by weight of the paste,
- wherein the paste comprises 10 to 25 parts by weight of the ether-containing material per 100 parts by weight of the paste, and
- wherein the anti-scattering film is disposed in the effective region between a plurality of patterns of the transparent electrode, the anti-scattering film filling areas between the first and second transparent electrodes;
- wherein one end of the interconnection electrode connected to at least one of the first transparent electrode and second transparent electrode and has a first width, and the other end of the interconnection electrode opposite to the one end has a second width;
- wherein the first width is greater than the second width, and
- wherein the interconnection electrode comprises a first bent portion and a second bent portion, the first bent portion having a shape of "T".

6. The touch panel according to claim 5, wherein the transparent electrode comprises indium tin oxides.

7. The touch panel according to claim 5, wherein the transparent electrode comprises copper oxides.

8. The touch panel according to claim 5, wherein the transparent electrode comprises carbon nano tubes.

* * * * *